US 9,232,664 B2

(12) United States Patent
Hugo et al.

(10) Patent No.: US 9,232,664 B2
(45) Date of Patent: Jan. 5, 2016

(54) HEAT TRANSFER DEVICE FOR WAVE SOLDERING

(71) Applicant: International Business Machines Corporation, Armonk, NY (US)

(72) Inventors: Stephen M. Hugo, Stewartville, MN (US); Matthew S. Kelly, Markham (CA)

(73) Assignee: International Business Machines Corporation, Armonk, NY (US)

(*) Notice: Subject to any disclaimer, the term of this patent is extended or adjusted under 35 U.S.C. 154(b) by 149 days.

(21) Appl. No.: 14/102,994

(22) Filed: Dec. 11, 2013

(65) Prior Publication Data
US 2014/0183250 A1 Jul. 3, 2014

Related U.S. Application Data

(63) Continuation of application No. 13/732,475, filed on Jan. 2, 2013.

(51) Int. Cl.
*B23K 31/02* (2006.01)
*H05K 3/34* (2006.01)
*B23K 1/08* (2006.01)
*B23K 3/06* (2006.01)
*H05K 13/04* (2006.01)
*H05K 1/02* (2006.01)

(52) U.S. Cl.
CPC .............. *H05K 3/3447* (2013.01); *B23K 1/085* (2013.01); *B23K 3/0653* (2013.01); *H05K 1/0292* (2013.01); *H05K 3/3468* (2013.01); *H05K 13/04* (2013.01); *H05K 2201/09127* (2013.01); *H05K 2203/044* (2013.01)

(58) Field of Classification Search
None
See application file for complete search history.

(56) References Cited

U.S. PATENT DOCUMENTS

| 3,482,755 A | * | 12/1969 | Raciti ............................. 228/34 |
| 3,588,245 A | | 6/1971 | Herriott et al. |
| 3,588,425 A | | 6/1971 | Erickson |
| RE30,399 E | * | 9/1980 | Ammann et al. .......... 228/180.1 |
| 4,321,423 A | * | 3/1982 | Johnson et al. .............. 174/16.3 |
| 4,421,265 A | * | 12/1983 | Boyer et al. ................ 228/180.1 |
| 4,506,939 A | | 3/1985 | Faulkenberry et al. |
| 4,739,919 A | * | 4/1988 | Van Den Brekel et al. .......................... 228/180.1 |
| 4,801,065 A | * | 1/1989 | Colquitt et al. .................. 228/19 |
| 4,848,644 A | * | 7/1989 | Cunningham ............. 228/180.1 |
| 4,871,106 A | * | 10/1989 | Wharff ......................... 228/49.5 |
| 4,964,560 A | * | 10/1990 | Wharff ......................... 228/49.5 |
| 5,198,693 A | | 3/1993 | Imken et al. |
| 5,256,902 A | | 10/1993 | Culver |
| 5,617,990 A | * | 4/1997 | Thompson, Sr. .......... 228/180.1 |
| 5,704,535 A | | 1/1998 | Thompson, Sr. |

(Continued)

FOREIGN PATENT DOCUMENTS

| EP | 2361001 A1 | * | 8/2011 |
| GB | 1504540 A | * | 3/1978 |

OTHER PUBLICATIONS

U.S. Appl. No. 13/732,475, filed Jan. 2, 2013, titled: "Heat Transfer Device for Wave Soldering".

*Primary Examiner* — Kiley Stoner
(74) *Attorney, Agent, or Firm* — L. Jeffrey Kelly; Damion Josephs

(57) ABSTRACT

A structure including a circuit board including a plane and a pin-in-hole component; and a heat transfer device, where the heat transfer device is thermally connected to the plane at a leading edge of the circuit board, the heat transfer device transfers heat from a wave of molten solder to the plane.

20 Claims, 6 Drawing Sheets

(56) References Cited

U.S. PATENT DOCUMENTS

| | | | |
|---|---|---|---|
| 5,785,307 A * | 7/1998 | Chung | 269/254 CS |
| 5,820,013 A | 10/1998 | Ortiz | |
| 5,831,826 A * | 11/1998 | Van Ryswyk | 361/719 |
| 6,023,841 A | 2/2000 | Concorso | |
| 6,023,847 A | 2/2000 | Niedl | |
| 6,045,032 A * | 4/2000 | Longgood et al. | 228/180.21 |
| 6,142,357 A * | 11/2000 | Howell | 228/39 |
| 6,189,210 B1 | 2/2001 | Cox et al. | |
| 6,237,832 B1 * | 5/2001 | Chung | 228/44.7 |
| 6,255,136 B1 | 7/2001 | Alcoe et al. | |
| 6,276,596 B1 * | 8/2001 | Gruber et al. | 228/225 |
| 6,353,998 B1 | 3/2002 | Cox et al. | |
| 6,513,702 B2 | 2/2003 | Mawatari | |
| 6,974,071 B2 | 12/2005 | Buley et al. | |
| 7,124,931 B2 | 10/2006 | Lewis et al. | |
| 2002/0075664 A1 * | 6/2002 | Perkins et al. | 361/816 |
| 2003/0216066 A1 * | 11/2003 | Arrigotti et al. | 439/79 |
| 2004/0222269 A1 | 11/2004 | Luo | |
| 2005/0022970 A1 | 2/2005 | Mania et al. | |
| 2005/0199995 A1 | 9/2005 | Nomoto et al. | |
| 2006/0102703 A1 * | 5/2006 | Akhtar et al. | 228/260 |
| 2006/0104855 A1 * | 5/2006 | Rothschild | 420/560 |
| 2007/0194456 A1 | 8/2007 | Cohn | |
| 2008/0055869 A1 * | 3/2008 | Hsiung | 361/752 |
| 2008/0307643 A1 * | 12/2008 | Sozansky | 29/839 |
| 2011/0316035 A1 | 12/2011 | Shin et al. | |
| 2012/0056234 A1 | 3/2012 | Lee et al. | |
| 2013/0264102 A1 * | 10/2013 | Holma et al. | 174/252 |
| 2014/0183250 A1 | 7/2014 | Hugo et al. | |

\* cited by examiner

US 9,232,664 B2

HEAT TRANSFER DEVICE FOR WAVE SOLDERING

CROSS REFERENCE

The present application is a continuation of and claims priority under 35 U.S.C. §120 of U.S. patent application Ser. No. 13/732,475, filed on Jan. 2, 2013, which is incorporated by reference in its entirety.

BACKGROUND

1. Field of the Invention

The present invention generally relates to the manufacture of electronic circuit boards, and, in particular, to a method and apparatus for transferring heat during a wave solder technique.

2. Background of Invention

Wave solder is a common method of connecting multiple electronic components or connectors to a circuit board using a wave of molten solder. A circuit board populated with pin-in-hole (PIH) electronic components or connectors is passed over a wave of molten solder. The molten solder wets the leads of the components and fills the plated-thru-holes (PTH) of the circuit board.

Typical wave solder techniques may suffer from a problem referred to as the 'leading edge' effect. The leading edge effect may be experienced when the PIH components at a leading edge of the circuit board experience higher hole fill defects than the PIH components at a trailing edge of the circuit board. The leading edge of the circuit board is the edge that contacts the wave of molten solder first, and the trailing edge is the edge that contacts the wave of molten solder last. The leading edge effect may be caused by a temperature differential between the PIH components at the leading edge of the circuit board versus the PIH components at the trailing edge of the circuit board. The temperature differential may be explained by a pre-heating effect experienced by the PIH components at the trailing edge of the circuit board. During a wave soldering technique heat may transfer from the leading edge of the circuit board to the trailing edge of the circuit board via a power plane or a ground plane, and in turn preheat the PIH components at the trailing edge of the circuit board. The pre-heating heating effect witnessed by the PIH components at the trailing edge of the circuit board may be responsible for the difference in hole fill defects between PIH components at the leading edge of the circuit board versus the trailing edge of the circuit board.

Therefore, pre-heating the PIH components at the leading edge of the circuit board to minimize or eliminate unwanted hole fill defects may, among other things, be desirable.

SUMMARY

According to one embodiment of the present invention, a structure is provided. The structure may include a circuit board including a plane and a pin-in-hole component, and a heat transfer device, where the heat transfer device is thermally connected to the plane at a leading edge of the circuit board, the heat transfer device transfers heat from a wave of molten solder to the plane.

According to another exemplary embodiment, a method is provided. The method may include providing a circuit board including a plane and a pin-in-hole component, providing a heat transfer device, and providing a wave solder device for generating a wave of molten solder. The method may further include moving the circuit board with respect to the wave solder device such that the heat transfer device contacts the wave of molten solder before the plane comes in contact with the wave of molten solder, and transferring heat from the wave of molten solder to the plane located at a leading edge of the circuit board via the heat transfer device before the plane comes in contact with the wave of molten solder.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Pin-in-hole (PIH) components at the leading edge of the circuit board may experience higher hole fill defects than PIH components at the trailing edge of the circuit board due to a pre-heating imbalance. As previously described above, the leading edge of the circuit board is the edge that contacts the wave of molten solder first, and the trailing edge is the edge that contacts the wave of molten solder last. The described exemplary embodiments may provide for a method by which heat transfer is actively managed in a manner similar to the way electrical energy would be managed using conductors and capacitors. Thus, thermal energy may be routed to preheat the leading edge of the circuit board and reduce or eliminate the leading edge effects described above. First, a description of the circuit board is provided.

Figure 1:
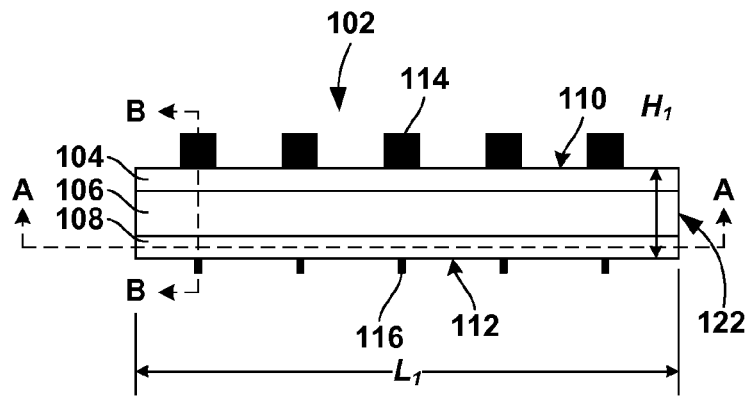
FIG. 1 illustrates an electronic circuit board according to an exemplary embodiment.
Figure 1A:
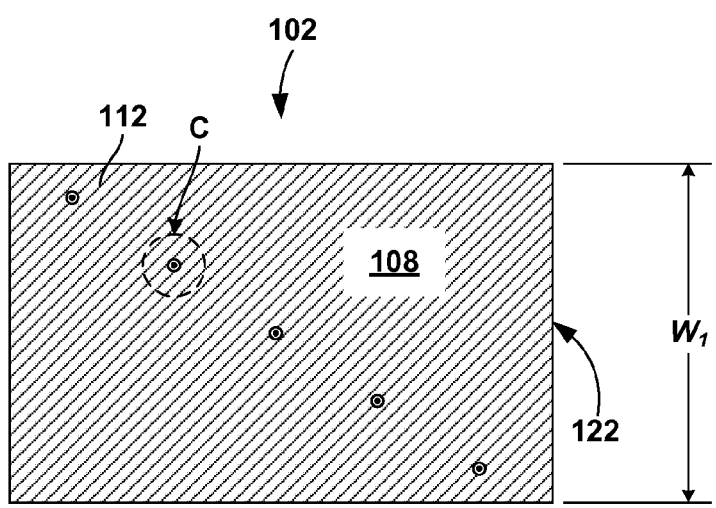
FIG. 1A illustrates a cross section view, section A-A, of FIG. 1 according to an exemplary embodiment.
Figure 1B:
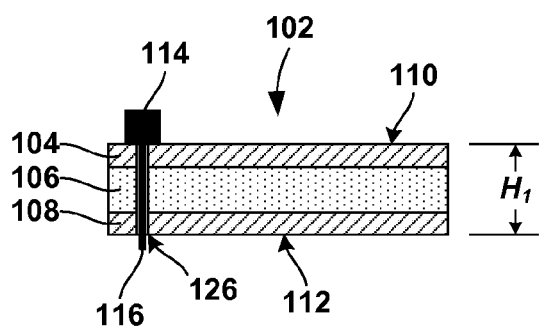
FIG. 1B illustrates a cross section view, section B-B, of FIG. 1 according to an exemplary embodiment.
Figure 1C:
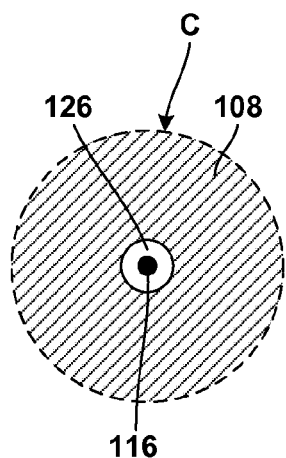
FIG. 1C illustrates a section view, section C, of FIG. 1A according to an exemplary embodiment.

Referring now to FIG. 1, a circuit board 102 is depicted. Cross section views of FIG. 1, section A-A and section B-B, and a section view, section C, are provided in FIGS. 1A, 1B, and 1C, respectively. The additional views provided in FIGS. 1A, 1B, and 1C are provided for additional clarity and understanding of the circuit board 102 depicted in FIG. 1.

The circuit board 102 may have multiple layers, for example, a first plane 104, a laminate 106, and a second plane 108. The circuit board 102 may have a length ($L_1$) (FIG. 1), a width ($W_1$) (FIG. 1A), and a thickness ($H_1$) (FIG. 1B) of a typical circuit board. The first plane 104 and the second plane 108 may include any electrically conductive trace typically incorporated into a circuit board. For example, the first plane 104 and the second plane 108 may be copper having a typical thickness commonly found in a circuit board. In a multi-layer circuit board, like the circuit board 102, one entire layer may be mostly solid copper to act as a ground plane for shielding and power return. The laminate 106 may include multiple layers of cloth and resin cured under pressure and temperature to form an integral structure of uniform thickness.

The circuit board 102 may further include one or more vias 126 (shown in FIGS. 1B, 1C) which may extend between a top surface 110 and a bottom surface 112 in which a component pin 116 of a PIH component 114 may be inserted. Solder may then be applied to the bottom surface 112 of the circuit board 102 and form a solder connection between the component pin 116 and the second plane 108. In one embodiment, the component pin 116 may be soldered to the second plane 108 using a known wave soldering technique, as described above. It should be noted that the solder connection between the component pin 116 and the second plane 108 is omitted from the figures for illustrative purposes only.

One embodiment for pre-heating the PIH component 114 at the leading edge of the circuit board 102 is described in detail below by referring to the accompanying drawings in FIGS. 2-2B, in accordance with an illustrative embodiment. In the present embodiment, a heat transfer device is joined to a plane, for example a power plane or ground plane, located at a leading edge of the circuit board 102. The heat transfer device may be connected to the plane via any suitable thermally conductive connection having sufficient structural integrity. The heat transfer device of the present embodiment may include a device which is separate and independent from the circuit board 102.

Figure 2:
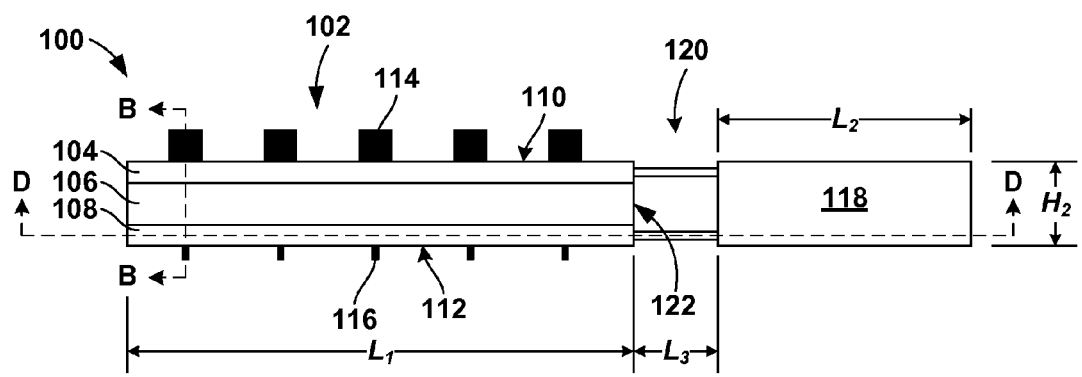
FIG. 2 illustrates an electronic circuit board having a heat transfer device according to an exemplary embodiment.
Figure 2A:
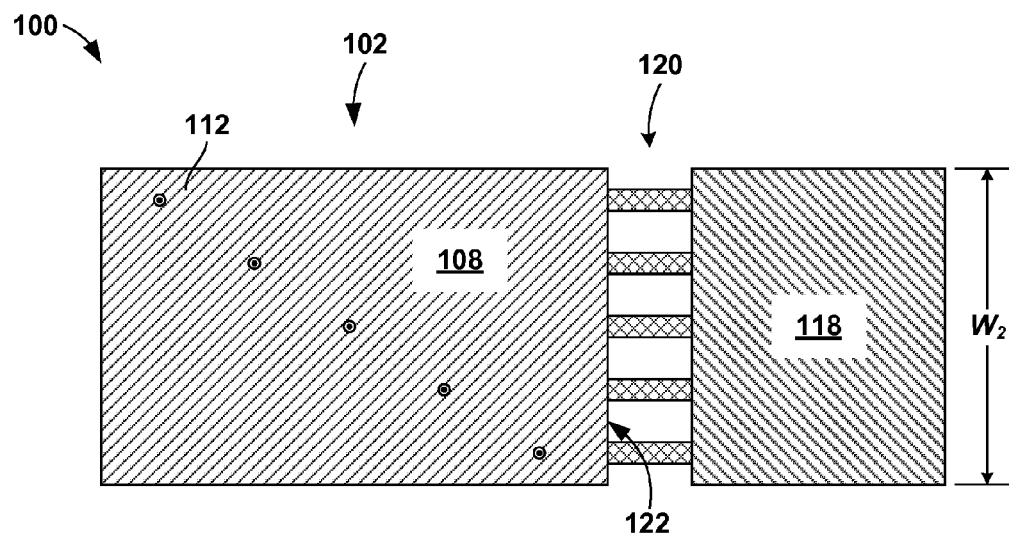
FIG. 2A illustrates a cross section view, section D-D, of FIG. 2 according to an exemplary embodiment.

Referring now to FIG. 2, a structure 100 including the circuit board 102 and a heat transfer device 118 joined together by a connection region 120, is shown. First, a description of the heat transfer device 118 will be provided followed by a description of the connection region 120. Furthermore, a cross section view of FIG. 2, section D-D, is provided in FIGS. 2A, and 2B, respectively. An alternative configuration of the present embodiment is illustrated and described in the cross section view shown in FIG. 2B.

With continued reference to FIG. 2, the heat transfer device 118 may include a separate and independent structure from the circuit board 102. In one embodiment, the heat transfer device 118 is physically connected to a leading edge 122 of the circuit board 102 via the connection region 120. Both the heat transfer device 118 and the connection region 120 are designed to route heat to a plane at the leading edge 122 of the circuit board 102. The addition of the heat transfer device 118 allows for the active management of the thermal gradient of the circuit board 102 during the wave solder technique.

In one embodiment, the heat transfer device 118 and the connection region 120 conduct heat from a wave of molten solder to either the first plane 104 or the second plane 108 at the leading edge 122 of the circuit board 102. In one embodiment, upon contact with the wave of molten solder, the heat transfer device 118 results in the plane at the leading edge 122 of the circuit board 102 to be heated to a temperature within about 10% to about 15% of the set point temperature of the wave of molten solder. For example, a solder including tin, copper, and nickel having a melting temperature of 227° C. and a set point temperature of 270° C. may be used in the wave solder technique. Therefore, in such cases, upon contact with the wave of molten solder, the heat transfer device 118 will heat the plane at the leading edge 122 of the circuit board 102 to a temperature within about 10% to about 15% of 270° C.

Heat transferred to the first or second planes 104, 108 at the leading edge 122 of the circuit board 102 during the wave solder technique may be designed to reduce the incidents of hole fill defects which may plague the solder connection between the component pin 116 and the first plane 104 or the second plane 108. Specific details of both the heat transfer device 118 and the connection region 120 are provided below.

The heat transfer device 118 may include any suitable thermally conductive material known in the art, for example, aluminum, copper, titanium, or any metal. In one embodiment, the heat transfer device 118 may include solid titanium. In one embodiment, the heat transfer device 118 may include a combination of materials, for example, as a compound or arranged in layers. In such instances, one or more of the materials may be thermally conductive and one or more materials may have poor thermal conductive properties. Any combination or configuration of thermally conductive material and non-thermally conductive material is explicitly envisioned.

The heat transfer device 118 may include any suitable size and shape as to conduct a desired amount of heat from the wave of molten solder to the plane at the leading edge 122 of the circuit board 102. The material, size, and shape of the heat transfer device 118 are directly correlated to its heat transfer characteristics, and may be adjusted accordingly to achieve the desired amount of conduction. In one embodiment, the heat transfer device 118 has a thickness ($H_2$) (FIG. 2) and a width ($W_2$) (FIG. 2A) equal to or less than the thickness ($H_1$) (FIG. 1B) and the width ($W_1$) (FIG. 1A) of the circuit board 102. Instances in which the heat transfer device 118 is wider and thicker than the circuit board 102 is explicitly envisioned. In one embodiment, the heat transfer device 118 has a length ($L_2$) (FIG. 2), as shown in the figure, ranging from about 0.25 inches to about 4 inches. In one embodiment, the heat transfer device 118 may be perforated, for example, having one or more holes, as depicted in FIG. 2B. In addition to perforations, cavities or voids that may not extend through the total thickness ($H_2$) of the heat transfer device 118 are explicitly envisioned.

Figure 2B:
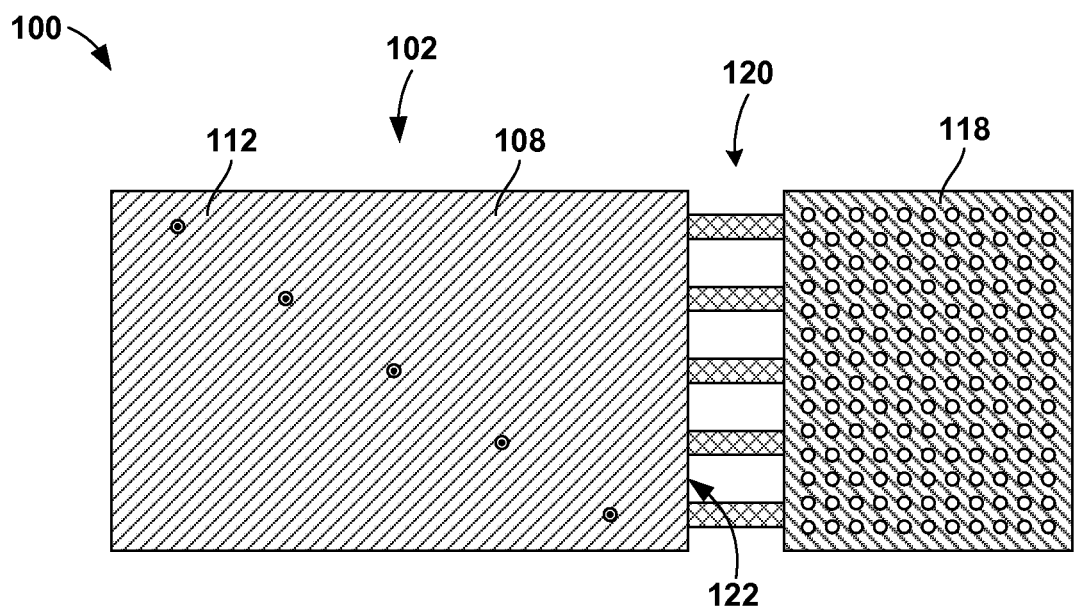
FIG. 2B illustrates a cross section view, section D-D, of FIG. 2 according to an exemplary embodiment.

Perforations or cavities, as shown in FIG. 2B, may be incorporated into the design of the heat transfer device 118 to achieve a specific amount of thermal conduction between the wave of molten solder and the plane. Both the amount of thermal conduction and the heat transfer rate may be considered in selecting an appropriate heat transfer device design.

As mentioned above, the connection region 120 physically joins the heat transfer device 118 to the leading edge 122 of the circuit board 102. Furthermore, the connection region 120 thermally joins the heat transfer device 118 to a plane, for example the first or second planes 104, 108, located at the leading edge 122 of the circuit board 102. More specifically, the connection region 120 is designed as a thermally conductive path between the heat transfer device 118 and a plane located at the leading edge 122 of the circuit board 102. The connection region 120 may include any suitable thermally conductive material known in the art, for example, aluminum, copper, titanium, or any metal. In one embodiment, the connection region 120 may include titanium. In one embodiment, similar to the heat transfer device 118 described above, the connection region 120 may include a combination of materials, for example, as a compound or arranged in layers. In such instances, one or more of the materials may be thermally conductive and one or more layers may have poor thermal conductive properties. Any combination of thermally conductive material and non-thermally conductive material is explicitly envisioned. Because the connection region 120 physically joins the heat transfer device 118 to the leading edge 122 of the circuit board 102 it shall include a material suitable for such a mechanical connection.

The connection region 120 may include any suitable size and shape as to conduct the desired amount of heat from the heat transfer device 118 to the plane at the leading edge 122 of the circuit board 102. In one embodiment, the connection region 120 may include a length ($L_3$) (FIG. 2) ranging from about 0.5 in to about 1 in, as measured from the heat transfer device 118 to the leading edge 122 of the circuit board 102, as shown in the figure. Furthermore, the connection region 120 may include any suitable size and shape to facilitate a sufficient physical connection between the heat transfer device 118 and the leading edge 122 of the circuit board 102. In general, a larger connection region may have increased heat transfer abilities and strength over a smaller connection region.

The heat transfer device 118 may be joined to a single plane or multiple planes with any suitable number of connections. The connection region 120 may include any suitable number and configuration of connections to conduct the desired amount of heat and provide appropriate structural attachment. In one embodiment, the structure 100 may include more than one connection, as depicted in the figure. The number of connections may affect the structure's 100 ability to withstand any physical stresses involved during the wave solder technique. In one embodiment, as shown in the figure, five connections join the heat transfer device 118 to the first plane 104 on the top surface 110 of the circuit board 102, and five connections join the heat transfer device 118 to the second plane 108 on the bottom surface 112 of the circuit board 102; however, any number of connections may be used. In general, more connections may have increased heat transfer abilities and strength over fewer connections.

In one embodiment, the connection between the heat transfer device 118 and the leading edge 122 of the circuit board 102 includes the use of mounting holes (not shown) which may be typically found around the edge or at the corners of a circuit board. The material, size, shape, and quantity of the connections located within the connection region 120 are directly correlated to the region's heat transfer characteristics, and may be adjusted accordingly to conduct the desired amount of heat to the plane(s) at the leading edge 122 of the circuit board 102.

It should be noted that both the heat transfer device 118 and the connection region 120 may preferably be used only during the wave solder technique and subsequently removed.

In one embodiment, an adjustable mechanism may be incorporated into the heat transfer device 118 to regulate the amount of heat conducted from the heat transfer device 118 to the circuit board 102. The adjustable mechanism may be capable of controlling the heat transfer characteristics of the heat transfer device 118 on-the-fly. In other words, the heat transfer characteristics of the heat transfer device 118 may be easily adjusted at the time of soldering using the adjustable mechanism. Furthermore, the adjustable mechanism may preferably not require tools, but the used of tools is however expressly envisioned. Multiple embodiments are envisioned and described below detailing the adjustable mechanism.

In one embodiment, the adjustable mechanism may include an adjustable shield (not shown) to control the amount of heat conducted from the heat transfer device 118 to the circuit board 102. The adjustable shield may operate in a linear or rotational fashion. In another embodiment, the adjustable mechanism may include incorporating two or more metal plates (not shown) into the design of the heat transfer device 118. The multiple metal plates may slide relative to one another to allow the effective size of the heat transfer device 118 to be adjusted on-the-fly, and in turn affecting the heat transfer characteristics. In such instances, the multiple metal plates shall be thermally connected to one another. In another embodiment, the heat transfer device 118 may include a fixed size and shape with a recessed or inset geometry capable of accepting a variety of interchangeable metal plates having different sizes or configurations. A variety of interchangeable metal plates may be available for on-the-fly adjustment of the heat transfer characteristics.

Another exemplary embodiment to pre-heat the PIH components at the leading edge of the circuit board is described in detail below by referring to the accompanying drawings in FIGS. 3-3D. In the present embodiment, a heat transfer device may be integrated into a circuit board and thermally connected to a plane, for example a power plane or ground plane, located at a leading edge of the circuit board. The heat transfer device may include similar characteristics as the power plane or the ground plan, and may be integrated into the standard circuit board construction.

Figure 3:
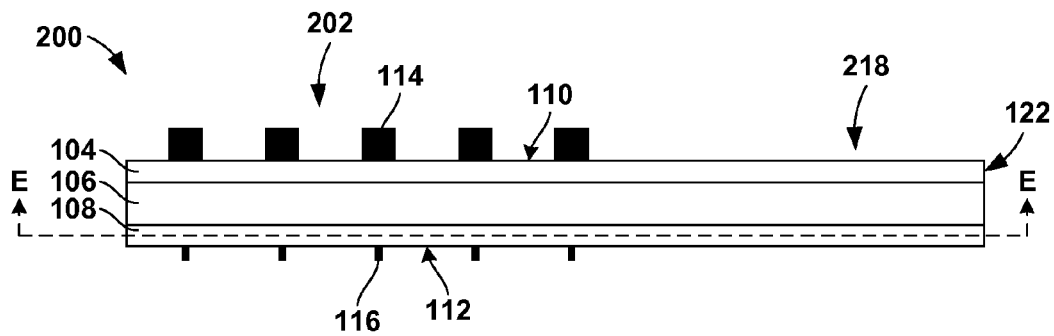
FIG. 3 illustrates an electronic circuit board having a heat transfer device according to another exemplary embodiment.
Figure 3A:
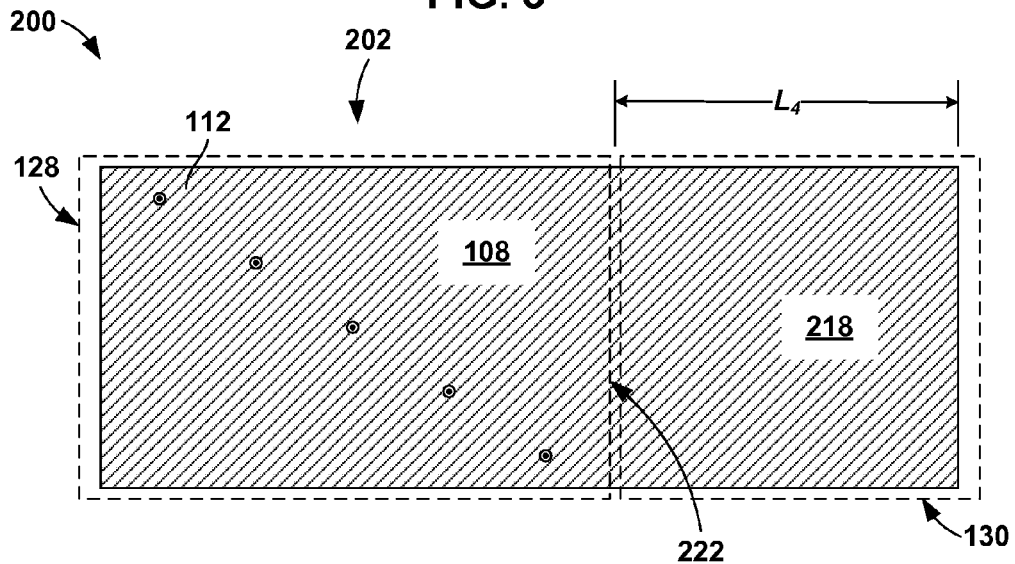
FIG. 3A illustrates a cross section view, section E-E, of FIG. 3 according to an exemplary embodiment.

Referring now to FIG. 3, a structure 200 including a circuit board 202 and an integrated heat transfer device 218, is shown. In the present embodiment, the integrated heat transfer device 218 may include an extension of a plane, for example the second plane 108, and no specific connection between the plane and the circuit board 202 is required (see FIG. 3A). In some instances, the structure 200 may include a portion of the second plane 108 which may be designated as a connection region 220 (see FIG. 3B) between the second plane 108 and the integrated heat transfer device 218. A cross section view of FIG. 3, section E-E, is provided in FIG. 3A.

With continued reference to FIG. 3, the second plane 108 of the circuit board 202 may include the integrated heat transfer device 218. In other words, the integrated heat transfer device 218 may include an extension of the second plane 108, and may have substantially similar characteristics as the second plane 108. In such instances, the integrated heat transfer device 218 is functionally the same as the heat transfer device 118 described above. In such instances, the circuit board 202 may be divided into two regions, a design region 128 and a sacrificial region 130. The design region 128 may encompass an area of the circuit board 202 containing active components and traces, while the sacrificial region 130 may encompass an area of the circuit board 202 which may be removed during a subsequent process step. This step is generally known in the industry as the de-panalization step. In this operation, a routing machine with the appropriate routing bit is used to cut off the sacrificial region 130 of the circuit board 102. Since electrical traces may be exposed, an additional step may be required to cover the edge of the circuit board 102 with a benign insulating material. The sacrificial region 130 is not part of the final design of the circuit board 202, and may be provided and used only during the fabrication of the circuit board 202.

Similar to the heat transfer device 118 described above with reference to FIG. 1, the integrated heat transfer device 218 conducts heat from the wave of molten solder from the sacrificial region 130 to a leading edge 222 of the design region 128. Like the heat transfer device 118, heat conducted via the integrated heat transfer device 218 is designed to reduce the incidents of hole fill defects described above. Specific details of the integrated heat transfer device 218 are provided below.

The integrated heat transfer device 218 may include substantially similar materials as the second plane 108. For example, the integrated heat transfer device 218 may be fabricated from copper at the same time as the second plane 108. In one embodiment, the integrated heat transfer device 218 includes any suitable conductive material that which is different from the material of the second plane 108. Materials described above with reference to the heat transfer device 118 are explicitly contemplated to be used in the integrated heat transfer device 218 in the present embodiment.

The integrated heat transfer device 218 may include any suitable size and shape as to conduct a desired amount of heat from the wave of molten solder to the plane at the leading edge 222 of the design region 128 of the circuit board 202. Like the heat transfer device 118 above, the material, size, and shape of the integrated heat transfer device 218 is directly correlated to its heat transfer characteristics, and may be adjusted accordingly to achieve the desired amount conduction. In one embodiment, the integrated heat transfer device 218 has a thickness and a width equal to or less than the thickness of the second plane 108 and the width of the circuit board 202, respectively. In one embodiment, the integrated heat transfer device 218 has a length ($L_4$) (FIG. 3A), as shown in the figure, ranging from about 0.25 inches to about 4 inches. Furthermore, the integrated heat transfer device 218 may include multiple conductive layers thermally connected to one another and located in the sacrificial region 130. The multiple conductive layers within the sacrificial region 130 may each correspond with a plane or trace of the design region 128.

Figure 3B:
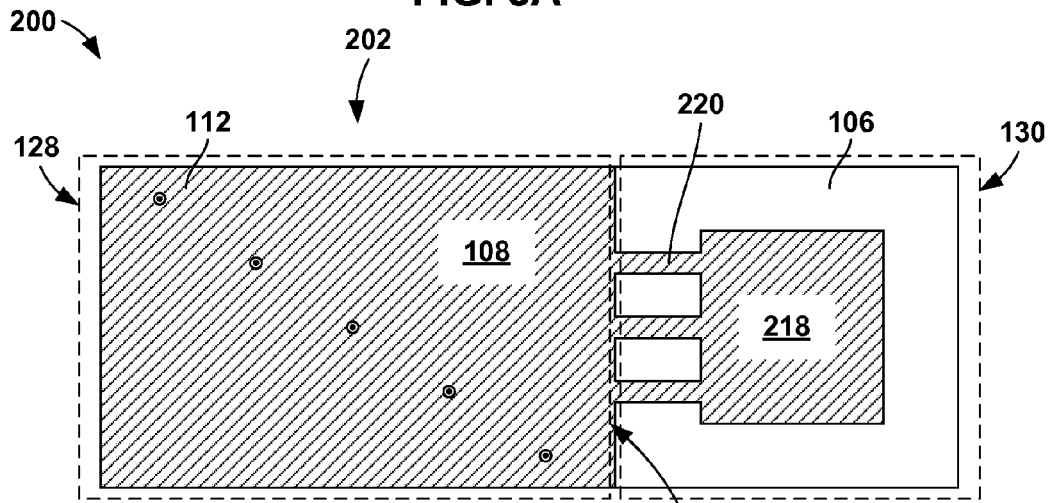
FIG. 3B illustrates a cross section view, section E-E, of FIG. 3 according to an exemplary embodiment.
Figure 3C:
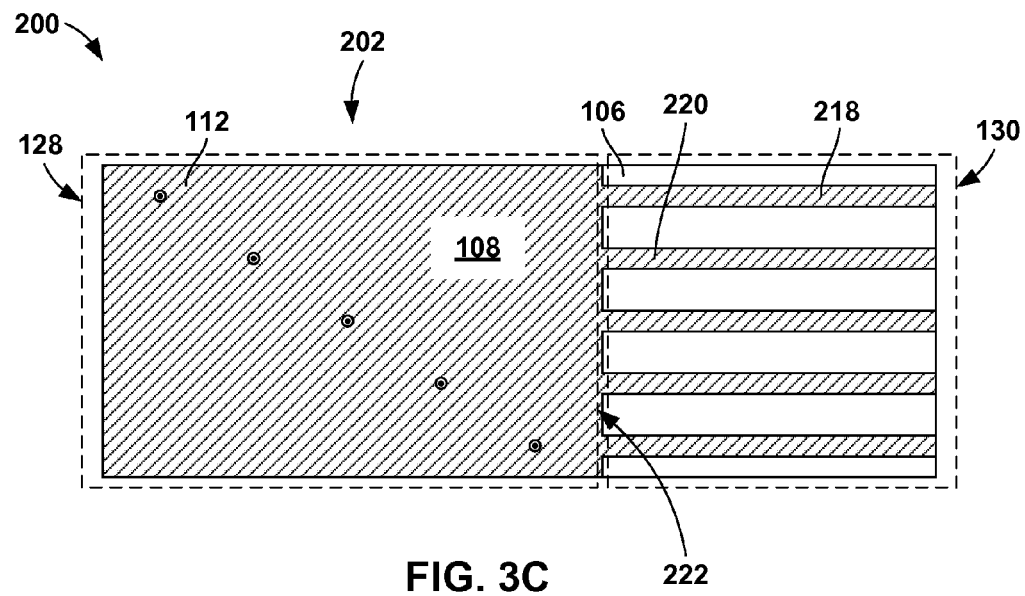
FIG. 3C illustrates a cross section view, section E-E, of FIG. 3 according to an exemplary embodiment.
Figure 3D:
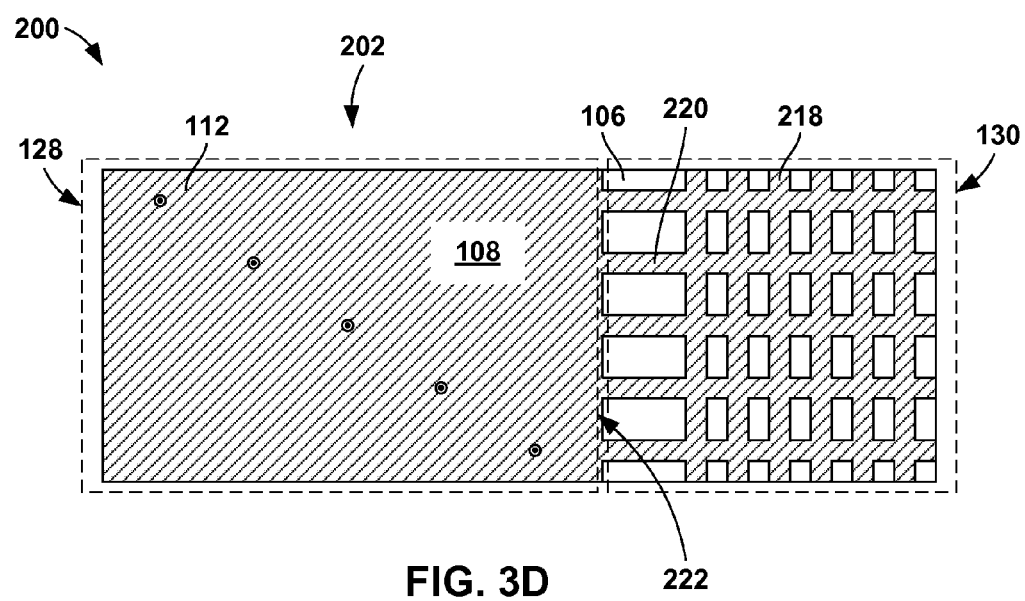
FIG. 3D illustrates a cross section view, section E-E, of FIG. 3 according to an exemplary embodiment.

Alternative configurations for the integrated heat transfer device are provided below with reference to the cross section views provided in FIGS. 3B, 3C, and 3D. Both the amount of thermal conduction and the heat transfer rate may be considered in selecting an appropriate heat transfer device design. Higher thermal conductivity and a faster heat transfer rate will be expected from an integrated heat transfer design having more conductive material compared to one with less conductive material. As briefly mentioned above, the second plane 108 may include a region which may be referred to as the connection region 220 (see FIGS. 3B-3D). The connection region 220, also integrated into the fabrication of the circuit board 202, may include any thermally conductive path between the integrated heat transfer device 218 and the leading edge 222 of the design region 128. Like the integrated heat transfer device 218, the connection region 220 may also be an extension of the second plane 108. The connection region 220 may be substantially similar to the integrated heat transfer device 218. In one embodiment, the connection region 220 may have a larger or smaller area of conductive material as compared to the integrated heat transfer device 218. An increase or decrease in the area of conductive material present in the connection area 220 may have an impact on the amount of heat conducted and the rate at which heat is conducted from the wave of molten solder to the leading edge 222 of the design region 128. Example configurations of the integrated heat transfer device 218 are provided in the cross section views depicted in FIGS. 3B, 3C, and 3D.

It should be noted that the integrated head transfer device 218 may conduct heat to one or multiple planes of the circuit board 202. In some cases the integrated heat transfer device may be located in a different layer than the plane with which it is designed to conduct heat to. In such instances, some thermally conductive path shall be formed across multiple layers to facilitate the appropriate thermal conduction. Also, the integrated heat transfer device 218 may be positioned at any layer within the circuit board 202, however, incorporating the integrated heat transfer device 218 into the bottom plane, or the plane which makes direct contact with the wave of molten solder, may be the most effective at conducting heat to the desired location(s) within the circuit board 202. In one embodiment, plated through holes (PTH) may be used to thermally connect the integrated heat transfer device 218 to the plane located in a different layer. Furthermore, the number and distribution of the PTHs may be directly related to the amount of thermal energy conducted from the integrated heat transfer device 218 and the targeted plane.

Figure 4:
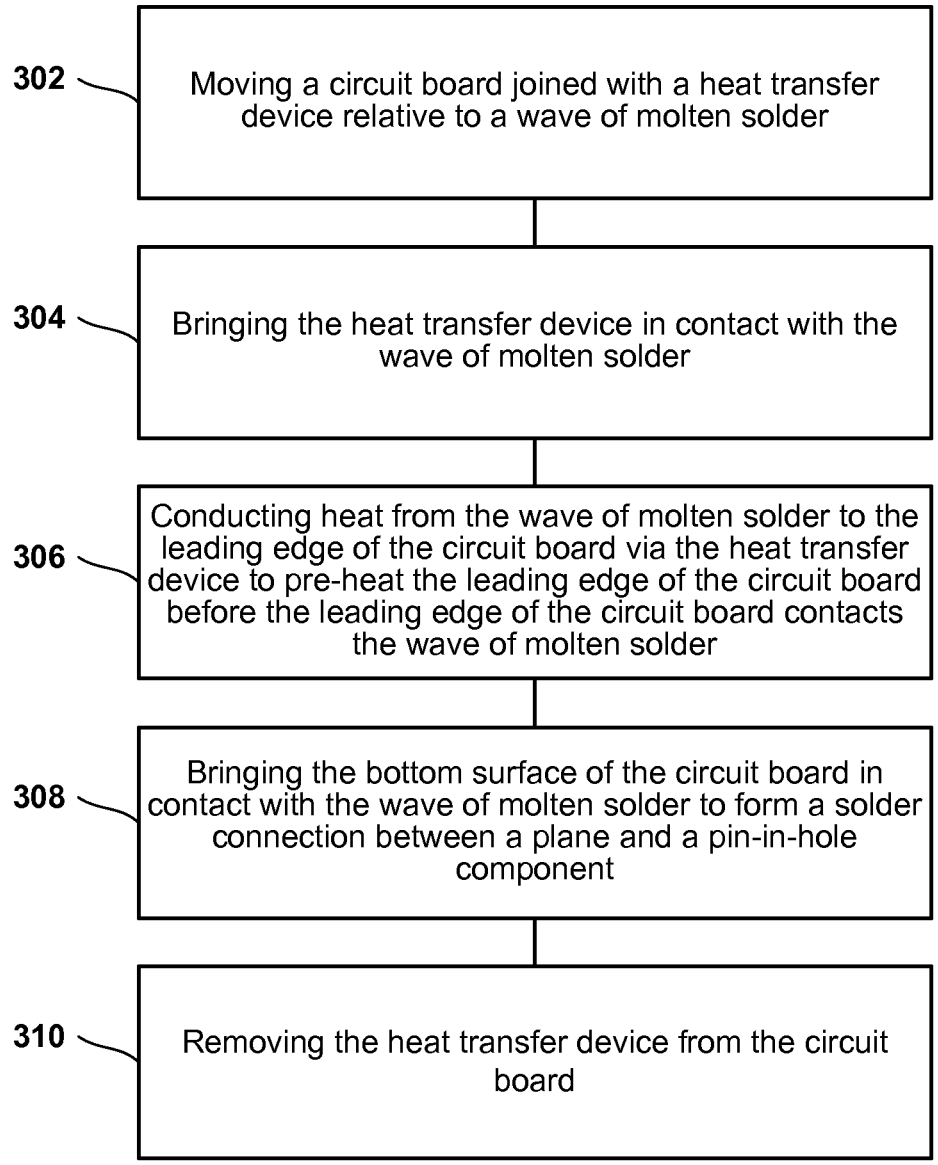
FIG. 4 illustrates a flow chart depicting the steps of a method of a wave soldering technique according to an exemplary embodiment.

Referring now to FIG. 4, a flow chart depicting the exemplary steps of a wave soldering technique is shown. At 302, a circuit board joined with a heat transfer device together may be moved relative to a wave of molten solder such that the heat transfer device contacts the wave of molten solder (304). For example, the circuit board 102 and the heat transfer device 118 shown in FIG. 2. At 306, heat from the wave of molten solder maybe conducted to a leading edge of the circuit board via the heat transfer device to pre-heat the leading edge of the circuit board. As previously described, pre-heating the leading edge of the circuit board may combat the leading edge effect and help reduce the occurrence of hole fill defects. For example, the leading edge 122 (FIG. 2) may be pre-heated before it comes in contact with the wave of molten solder to be most effective. At 308, the bottom surface of the circuit board may be moved to contact the wave of molten solder to form a solder connection between a plane and a pin-in-hole component. Finally, at 310, the heat transfer device may preferably be removed from the circuit board.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    moving a circuit board joined with a heat transfer device relative to a wave of molten solder;
    bringing the heat transfer device in contact with the wave of molten solder;
    conducting heat from the wave of molten solder to a leading edge of the circuit board via the heat transfer device to preheat the leading edge of the circuit board before the leading edge of the circuit board contacts the wave of molten solder; and
    bringing a bottom surface of the circuit board in contact with the wave of molten solder to form a solder connection between a plane and a pin-in-hole component, wherein the heat transfer device comprises an adjustable mechanism for varying the conduction of heat from the wave of molten solder to the plane.

2. The method of claim 1, further comprising:
removing the heat transfer device from the circuit board.

3. The method of claim 1, wherein conducting heat from the wave of molten solder to the leading edge of the circuit board via the heat transfer device comprises:
preheating the leading edge of the circuit board to a temperature within about 10% to about 15% of the set point temperature of the wave of molten solder.

4. The method of claim 1, wherein the heat transfer device is a component independent from the circuit board.

5. The method of claim 1, wherein the heat transfer device is an integrated component of the circuit board.

6. The method of claim 1, wherein the heat transfer device is physically coupled to the leading edge of the circuit board via a connection region which provides a thermally conductive path between the heat transfer device and the circuit board.

7. The method of claim 1, wherein the adjustable mechanism of the heat transfer device comprises perforations or cavities used to tune thermal conduction between the wave of molten solder and the circuit board.

8. A method comprising:
moving a circuit board and a heat transfer device relative to a wave of molten solder, the heat transfer device is coupled to an electrical trace at a leading edge of the circuit board;
bringing the heat transfer device in contact with the wave of molten solder;
conducting heat from the wave of molten solder to the electrical trace at the leading edge of the circuit board via the heat transfer device to pre-heat the electrical trace before the leading edge of the circuit board contacts the wave of molten solder; and
bringing a bottom surface of the circuit board in contact with the wave of molten solder to form a solder connection between the electrical trace and a pin-in-hole component, wherein the heat transfer device comprises an adjustable mechanism for varying the conduction of heat from the wave of molten solder to the electrical trace.

9. The method of claim 8, further comprising:
removing the heat transfer device from the circuit board.

10. The method of claim 8, wherein conducting heat from the wave of molten solder to the electrical trace at the leading edge of the circuit board via the heat transfer device comprises:
preheating the leading edge of the circuit board to a temperature within about 10% to about 15% of the set point temperature of the wave of molten solder.

11. The method of claim 8, wherein the heat transfer device is a component independent from the circuit board.

12. The method of claim 8, wherein the heat transfer device is an integrated component of the circuit board.

13. The method of claim 8, wherein the heat transfer device is physically coupled to the electrical trace at the leading edge of the circuit board via a connection region which provides a thermally conductive path between the heat transfer device and the electrical trace.

14. The method of claim 8, wherein the adjustable mechanism of the heat transfer device comprises perforations or cavities used to tune thermal conduction between the wave of molten solder and the electrical trace.

15. A method comprising:
moving a circuit board and a heat transfer device relative to a wave of molten solder, the heat transfer device is coupled to a plane at a leading edge of the circuit board;
bringing the heat transfer device in contact with the wave of molten solder;
preheating the plane at the leading edge of the circuit board before the leading edge of the circuit board contacts the wave of molten solder by using the heat transfer device to conduct heat from the wave of molten solder to the plane; and
bringing a bottom surface of the circuit board in contact with the wave of molten solder to form a solder connection between the plane and a pin-in-hole component, wherein the heat transfer device comprises an adjustable mechanism for varying the conduction of heat from the wave of molten solder to the plane.

16. The method of claim 15, wherein preheating the plane at the leading edge of the circuit board comprises:
preheating the leading edge of the circuit board to a temperature within about 10% to about 15% of the set point temperature of the wave of molten solder.

17. The method of claim 15, wherein heat transfer device is a component independent from the circuit board.

18. The method of claim 15, wherein the heat transfer device is an integrated component of the circuit board.

19. The method of claim 15, wherein the heat transfer device is physically coupled to the plane at the leading edge of the circuit board via a connection region which provides a thermally conductive path between the heat transfer device and the plane.

20. The method of claim 15, wherein the adjustable mechanism of the heat transfer device comprises perforations or cavities used to tune thermal conduction between the wave of molten solder and the plane.

* * * * *